Aug. 20, 1963 J. P. STELMAK 3,100,927

SEMICONDUCTOR DEVICE

Filed Dec. 30, 1957 2 Sheets-Sheet 1

WITNESSES

John E. Healy Jr.

Robert C. Baird

INVENTOR

John P. Stelmak

BY Homer O. Blair

ATTORNEY 3,100,927
SEMICONDUCTOR DEVICE
John P. Stelmak, Greensburg, Pa., assignor to Westinghouse Electric Corporation, East Pittsburgh, Pa., a corporation of Pennsylvania
Filed Dec. 30, 1957, Ser. No. 706,039
5 Claims. (Cl. 29—25.3)

This invention relates to semiconductor devices and, more particularly, to a transistor device.

It is well known that a junction transistor ordinarily consists of an emitter and a collector made of semiconductor material of one conductivity type such as p or n with a base between the emitter and the collector which is made of a semiconductor material of the opposite conductivity type. There is a p-n junction between the emitter and the base and another p-n junction between the collector and the base. In order to utilize a transistor of this nature, lead wires must be attached to the emitter, collector, and the base. The lead wires may then be connected in an external circuit as desired. The attachment of lead wires to elements of the transistors has always been a particularly tedious and difficult operation which is time consuming and generally results in large losses during fabrication. This lead attachment process has usually required hand alignment of fine wires having a diameter of 0.005 inch or less, which must be contacted with junction sizes which may be of the same order of magnitude. After the alignment, heat must be applied for soldering the leads to the element.

It is a general object of this invention to avoid the difficulties in attaching lead wires to the elements by the use of a new transistor structure which eliminates the delicate lead attachment process.

It is another object of this invention to provide an improved method for constructing the transistor in which a number of steps are eliminated, thus providing less opportunity for shrinkage losses.

It is a further object to provide a method of making the transistors in which an emitter connector is joined to the emitter at the same time that the p-n junctions are formed.

It is an additional object of the invention to provide a method of making a transistor in which a base connector is joined to the base at the same time the p-n junctions are formed.

It is an auxiliary object to provide a method of making the transistor in which a deformable collector connector is utilized which does not require soldering when it is joined to the collector.

It is a supplementary object to provide a transistor structure in which a collector-connector can be utilized to provide heat dissipation.

It is still another object to provide a transistor structure which is particularly adaptable to semiautomatic and automatic assembly.

These and other objects of this invention will be apparent from the following detailed description, taken in accordance with the accompanying drawing, throughout which like reference characters indicate like parts, which drawing forms a part of this application and in which.

Figure 2:
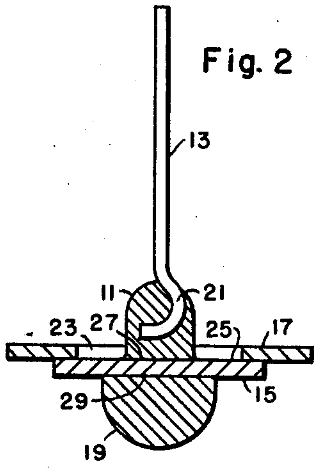
FIG. 2 is a front sectional view of the subassembly of a transistor structure shown in FIG. 1 taken along the line II—II.

With specific reference to the form of the invention shown in FIGS. 1–4, an emitter member 11 is shown which is fused to a base member 15 so that a p-n junction exists between the emitter member 11 and the base member 15. A collector member 19 is shown on the other side of the base member 15 so that a p-n junction is formed between the base member 15 and the collector member 19. A base connector member 17 is shown fused to the base member 15 and is provided with a base connector member tab portion 31. An emitter-connector 13 is attached to the emitter member 11 by means of an emitter-connector hook portion 21 which is embedded in the emitter member 11. The base connector 17 is provided with a base connector aperture portion 23 which leaves the base member center portion 25 uncovered by the base connector 17. The emitter-base p-n- junction 27 and the collector-base p-n junction 29 are also shown.

Figure 5:
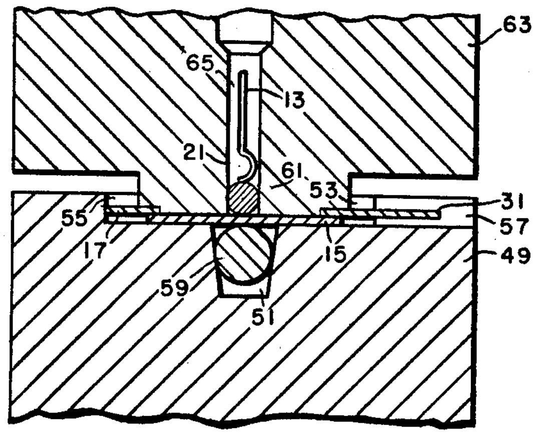
FIG. 5 is a side sectional view of holder members and elements of a transistor during the manufacturing process in accordance with one embodiment of my invention.
Figure 6:
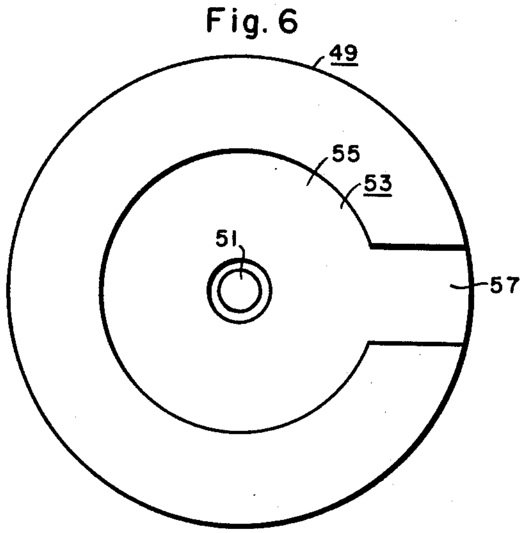
FIG. 6 is a top view of the first holder member 49 shown in FIG. 5.

In accordance with one embodiment of my invention the transistor structure shown in FIGS. 1 to 4 may be made in the following manner with reference to FIGS. 5 and 6. A spherical collector pellet 59 may be made of a conductor material such as an alloy of 0.3% gallium, 0.5% zinc, and the remainder indium. This spherical collector pellet 59 may be placed in a suitable holder member. By way of an example but not in limitation of my invention, suitable holder members are shown in FIGS. 5 and 6. A first holder member 49 is shown having a first recess 51 which is suitable for receiving the spherical collector pellet 59. In some cases it may be desirable to make the top of the recess 51 slightly larger than the bottom of the recess 51, in order to position the spherical collector pellet 59 in a predetermined manner. In one embodiment of my invention the collector pellet may be a sphere having a diameter of 0.045 inch and the first recess 51 may have a depth of 0.040 inch, a top diameter of 0.0465 inch and a bottom diameter of 0.0445 inch in diameter.

A base member 15, which may be made of a material such as germanium, containing n-type impurities to give suitable electrical resistivity of about 2 ohm-cm. may then be placed on top of the pellet 59. The doping impurity material within the base member 15 is, of course, opposite in type to those in the collector and emitter pellets 59 and 61. This base member 15 may be placed in a second recess 53 in the first holder member 49. It can be seen that the second recess 53 has a central portion 55 and a side portion 57. In one particular embodiment of my invention, a base member is etched to a slab having the dimensions of 0.086 inch by 0.086 inch by 0.005 inch. The central portion 55 of the second recess 53 may have a diameter of 0.125 inch with the side portion 57 having a width of 0.065 inch. Also the second recess 53 may have a depth of 0.015 inch.

Next, a base connector member 17 is placed upon the base crystal member 15 in the first holder member 49. The base connector member 17 has an aperture portion 23 which is positioned so that the central portion 25 of the base member 15 is uncovered. The base connector tab portion 31 is positioned in the side portion 57 of the second recess 53. In one particular embodiment the base connector member 17 may be made of nickel which is clad with tin on the side of the base connector member 17 adjacent the base member 15.

Also shown in FIG. 5 is a second holder member 63 having a cavity portion 65 by means of which the emitter pellet 61 is positioned on the upper surface of the base member 15 so that the central axes of the emitter pellet 61 and the collector pellet 59 are aligned with a deviation of less than 0.002 inch. The emitter pellet 61 may be in the form of 0.02 inch diameter sphere of an indium alloy similar to that used for the collector pellet 59. Next, an emitter connector member 13, which may be made of nickel wire having a diameter of 0.005 inch, is positioned within the cavity portion 65 of the second holder member 63 so that it rests on top of the emitter pellet 51. The portion of the emitter-connector 13, which is adjacent the emitter pellet 61, may be formed in the shape of a hook portion 21.

The subassembly is then fused in a vacuum or suitable neutral or reducing atmosphere, such as a mixture of nitrogen and hydrogen, while still in the holder members 49 and 63. If desired, the holder members 49 and 63 may be placed in a fusion boat for the fusing operation. Suitable times and temperatures that have been used for heating include a maximum holding temperature of approximately 550° C. for a period of approximately one-half hour.

Figure 1:
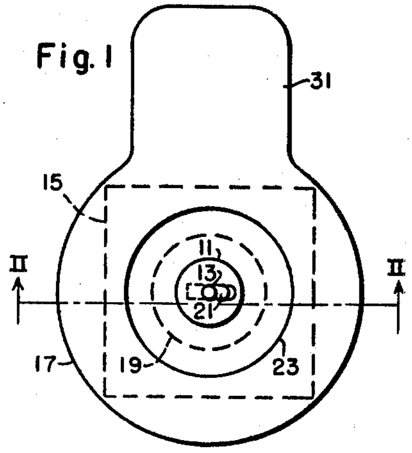
FIGURE 1 is a top view of a subassembly of a transistor structure in accordance with one embodiment of this invention.

After the fusing process, the subassembly has the appearance of that shown in FIGS. 1 and 2 with an emitter-base p-n junction 27 formed between the emitter member 11 and the base member 15 and with a collector-base p-n junction 29 formed between the base member 15 and the collector member 19. Also, the hook portion 21 of the emitter-connector 13 has become embedded in and joined to the emitter member 11. As is readily apparent, the two p-n junction have been formed and the emitter-connector 13 has been attached to the emitter member 11 and the base connector 17 has been attached to the base member 15 in a single simple operation.

Figure 3:
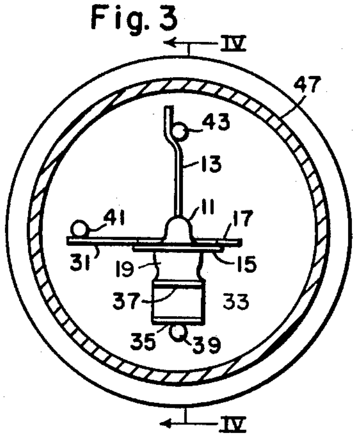
FIG. 3 is a top view of a completed transistor with the top of the cap member removed, which transistor is constructed in accordance with one embodiment of this invention.
Figure 4:
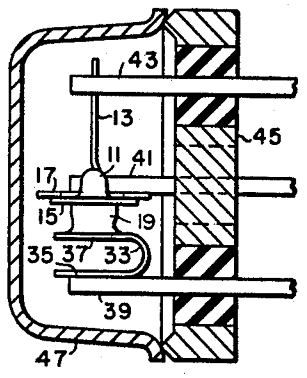
FIG. 4 is a side sectional view of the transistor shown in FIG. 3 generally taken along lines IV—IV.

Next, a collector-connector 33, which may be of the shape shown in FIGS. 3 and 4, is attached to a collector lead member 39 by a suitable method such as spot welding the collector-connector lead contact portion 35 to the collector lead member 39. Then the subassembly shown in FIGS. 1 and 2 is placed in position so that the collector member 19 is in contact with the collector-connector collector-contact portion 37 in such a manner that the collector-connector 33 is under stress and is slightly deflected. The base connector tab portion 31 is spot welded to a base lead member 41 and the emitter connector 13 is spot welded to an emitter lead member 43. Next, heat is applied to the collector member 19 by any suitable means, such as heating the collector-connector member 33 by a heated soldering iron or by hot gas, so the material of the collector member 19 wets the collector-connector collector-contact portion 37 and, because of this wetting and the pressure exerted by the slightly deflected collector-connector 33, the collector member 19 is strongly joined to the collector-connector 33 upon cooling. The collector lead member 39, the base lead member 41 and the emitter lead member 43 extend through a header member 45. The transistor structure is encapsulated in a suitable silicone material and a cap member 47 is attached to the header member 45, thus completing the assembly of the structure.

The invention has been disclosed in a particular embodiment only and it is apparent that it may be varied in many respects such as different means of attaching the connector members to the lead wires, etc., without departing from the spirit and scope of the invention. The size and shape of the collector-connector member 33 may be varied in various ways in order to increase the heat dissipation of the collector 19 and to provide ease of assembly depending upon the shape of the welding electrode and the various fixtures used. It may be desirable in some instances to weld the collector-connector 33 directly to the header member 45 for maximum heat dissipation.

The particular transistor structure disclosed has been used in a p-n-p audio transistor which is capable of dissipating up to 200 milliwatts. This particular transistor is used as an audio driver, as a class A output amplifier and, when paired, as a class B amplifier.

Before the transistor structure is encapsulated, it is frequently desirable to etch the structure electrolytically in alkali, such as sodium hydroxide, to improve the leakage characteristics of the device by removing surplus material around the junctions. Of course, it is readily apparent that the one step subassembly method may be utilized in other semiconductor devices such as semiconductor diodes and that the collector-connector 33 may be made in a large variety of shapes. However, the collector-connector 33 should be capable of being deflected under stress. Also, the collector-connector 33 may be used in other semiconductor devices such as diodes.

While the present invention has been shown in one form only, it will be obvious to those skilled in the art that it is not so limited but is susceptible of various changes and modifications without departing from the spirit and scope thereof.

I claim as my invention:

1. In a method of making a semiconductor device, the steps of: placing a connector member of a metallic material in the form of a flat ribbon having a surface of large area in contact with a fused alloy on a semiconductor member by slightly deflecting said connector member so that said connector member is under stress and a portion of said large area surface exerts pressure against said fused alloy; applying heat to said fused alloy so that said fused alloy wets at least said portion of the large area surface of said connector member; and cooling said fused alloy so that said connector member is joined to said fused alloy.

2. In a method of making a semiconductor device, the steps including: obtaining a semiconductor member having a fused alloy in rectifying contact therewith; obtaining a contact member comprising a ribbon-like metallic member having a first portion, a second portion and at least one bend therebetween; attaching said first portion of said contact member to a lead member; placing said semiconductor member with said fused alloy in contact with said second portion of said contact member so said contact member is under stress solely between said fused alloy and said lead member; heating said fused alloy to cause the material thereof to become molten and wet said second portion of said contact member over a larger area than the initial contact between said fused alloy and said second portion; cooling to form a strong bond between said fused alloy and said contact member.

3. The method of making a semiconductor device, said method including the steps of: placing a collector pellet in a recess in a lower holder member, said collector pellet having a first type of doping impurity and being of such a size and shape that a portion thereof extends from said recess in said lower holder member while said pellet is solely supported by the walls of said recess; placing a semiconductor base member on said collector pellet, said base member having a second type of doping impurity; placing a base connector member on said base member so that a center portion of said base member is uncovered; placing an emitter pellet on said center portion of said base member; said emitter pellet having said first type of doping impurity; placing an emitter-connector member in contact with said emitter pellet; placing an upper holder member in contact with said base connector member without any appreciable contact with said emitter pellet; heating the above components to (*a*) form a collector member having a fused p-n junction with said base member and an emitter member having a fused p-n junction with said base member, and to (*b*) join said emitter-connector member to said emitter member; attaching a collector-connector member to a collector lead member; placing said collector-connector member in contact with said collector member so that said collector-connector member is under stress and is slightly deflected; applying heat to said collector member so that said collector member wets said collector-connector; and cooling said collector member so that said collector-connector member is joined to said collector member.

4. A method of manufacturing a semiconductor device comprising the steps of: placing a collector pellet in a recess in a lower holder member, said collector pellet having a first type of doping impurity and being of such a size and shape that a portion thereof extends from said recess in said lower holder member while said pellet is solely supported by the walls of said recess; placing a semiconductor base member on said collector pellet so that said semiconductor base member is substantially in a horizontal plane, said base member having a second type of doping impurity; placing a base connector member on said base member, so that a center portion of said base member is uncovered; placing an emitter pellet on said center portion of said base member, said emitter pellet having said first type of doping impurity; deforming an emitter-connector member; placing a deformed portion of said emitter-connector member in contact with said emitter pellet; supporting said emitter-connector member within an upper holder member substantially only by said emitter pellet; placing said upper holder member in contact with said base connector member without any appreciable contact with said emitter pellet; heating the above components to (*a*) form a collector member having a fused p-n junction with said base member and an emitter member having a fused p-n junction with said base member, and to (*b*) join said emitter-connector member to said emitter member.

5. A method of manufacturing a semiconductor device comprising the steps of: placing a collector pellet in a lower holder member, said collector member having a first type of doping impurity and being of such a size and shape that a portion thereof extends from said recess in said lower holder member while said pellet is solely supported by the walls of said recess; placing a semiconductor base member on said collector pellet, said base member having a second type of doping impurity; placing a base connector member on said base member so that a center portion of said base member is uncovered; placing an emitter pellet on said center portion of said base member, said emitter pellet having said first type of doping impurity; placing an emitter-connector member having a deformed portion in contact with said emitter pellet; supporting said emitter-connector member within an upper holder member substantially only by said emitter pellet; placing said upper holder member in contact with said base connector member without any appreciable contact with said emitter pellet; heating the above components to (*a*) form a collector member having a fused p-n junction with said base member and an emitter member having a fused p-n junction with said base member, and to (*b*) join said emitter-connector member to said emitter member; attaching a collector-connector member of a metallic material in the form of a flat ribbon having a surface of large area to a collector lead member; placing said collector-connector member in contact with said collector member so that said collector-connector member is under stress and is slightly deflected; applying heat to said collector member so that said collector member wets the large area surface of said collector-connector member; and cooling said collector member so that said collector-connector member is joined to said collector member.

References Cited in the file of this patent

UNITED STATES PATENTS

| | | |
|---|---|---|
| 2,731,704 | Spanos | Jan. 24, 1956 |
| 2,735,919 | Shower | Feb. 21, 1956 |
| 2,765,516 | Haegele | Oct. 9, 1956 |
| 2,778,980 | Hall | Jan. 22, 1957 |
| 2,792,538 | Pfann | May 14, 1957 |
| 2,793,332 | Alexander et al. | May 21, 1957 |
| 2,796,563 | Ebers et al. | June 18, 1957 |
| 2,833,969 | Christian | May 6, 1958 |
| 2,862,470 | Williams | Dec. 2, 1958 |
| 2,878,432 | Armstrong et al. | Mar. 17, 1959 |
| 2,896,134 | Myer | July 2, 1959 |
| 2,913,642 | Jenny | Nov. 17, 1959 |
| 2,962,396 | Pankove | Nov. 29, 1960 |